United States Patent

Zhu et al.

(10) Patent No.: US 9,502,970 B2
(45) Date of Patent: Nov. 22, 2016

(54) CHARGE PUMP WITH SUPPRESSED FEEDTHROUGH EFFECT

(71) Applicant: SEMICONDUCTOR MANUFACTURING INTERNATIONAL (SHANGHAI) CORPORATION

(72) Inventors: Guang Zhu, Shanghai (CN); Guang Tao Feng, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/856,540

(22) Filed: Sep. 16, 2015

(65) Prior Publication Data

US 2016/0087525 A1 Mar. 24, 2016

(30) Foreign Application Priority Data

Sep. 19, 2014 (CN) .......................... 2014 1 0483106

(51) Int. Cl.
| | | |
|---|---|---|
| *H03L 7/06* | (2006.01) | |
| *H02M 3/07* | (2006.01) | |
| *H03L 7/089* | (2006.01) | |
| *H03L 7/18* | (2006.01) | |

(52) U.S. Cl.
CPC .............. *H02M 3/07* (2013.01); *H03L 7/0891* (2013.01); *H03L 7/18* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 7,944,376 B2* | 5/2011 | Jensen | ................... | H04L 27/368 327/157 |
| 8,040,168 B2* | 10/2011 | Sakiyama | ............... | H02M 3/07 327/148 |
| 8,581,643 B1* | 11/2013 | Schmitt | ..................... | H03L 7/07 327/147 |
| 2002/0149407 A1* | 10/2002 | Ingino, Jr. | ............ | H03K 3/0315 327/157 |
| 2007/0229130 A1* | 10/2007 | Lee | ........................ | H03L 7/0891 327/157 |
| 2008/0042722 A1* | 2/2008 | Dornbusch | ...... | H03K 19/01851 327/333 |
| 2009/0033381 A1* | 2/2009 | Lee | ........................ | H03L 7/085 327/156 |
| 2011/0063969 A1* | 3/2011 | Kawamoto | ........... | H03L 7/0893 369/126 |
| 2016/0087525 A1* | 3/2016 | Zhu | ........................ | H02M 3/07 327/157 |

\* cited by examiner

*Primary Examiner* — Adam Houston

(74) *Attorney, Agent, or Firm* — Kilpatrick Townsend and Stockton LLP

(57) ABSTRACT

A charge pump circuit includes a capacitor, a current source circuit coupled to the capacitor for providing a charging current and a discharging current to the capacitor. The current source circuit includes a switch transistor with a gate terminal for receiving a control signal, a current source transistor having a source terminal coupled to a drain of the switch transistor, and a feedthrough suppression capacitor coupled between a gate terminal of a gate terminal of the switch transistor and a gate terminal of the current source transistor. The feedthrough suppression capacitor is configured to lower a feedthrough effect.

17 Claims, 6 Drawing Sheets

CHARGE PUMP WITH SUPPRESSED FEEDTHROUGH EFFECT

CROSS-REFERENCES TO RELATED APPLICATIONS

This application claims priority to Chinese patent application No. 201410483106.1, filed on Sep. 19, 2014, the content of which is incorporated herein by reference in its entirety. This application is also related to U.S. Pat. No. 6,255,872 to Harada et. al., filed Mar. 26, 1999, the content of which is incorporated by reference herein in its entirety.

BACKGROUND OF THE INVENTION

The present invention relates to the field of electronic circuit technology; specifically it relates to a phase lock loop (PLL) circuit.

A phase-locked loop (PLL) is a control system that generates an output signal whose phase is related to the phase of an input signal. In a simplified version, a PLL can be viewed as an electronic circuit having a variable frequency oscillator and a phase detector. The oscillator generates a periodic signal, and the phase detector compares the phase of that signal with the phase of an input periodic signal and adjusts the oscillator to keep the phases matched. A feedback loop is used to couple the output signal back to the input signal for comparison.

In addition to synchronizing signals, a phase-locked loop can track an input frequency, and it can generate a frequency that is a multiple of the input frequency. These properties are used for computer clock synchronization, demodulation, and frequency synthesis, etc. For example, phase-locked loops are widely employed in radio, telecommunications, computers, and other electronic applications. They can be used to demodulate a signal, recover a signal from a noisy communication channel, generate a stable frequency at multiples of an input frequency (frequency synthesis), or distribute precisely timed clock pulses in digital logic circuits such as microprocessors. Since a single integrated circuit can provide a complete phase-locked-loop building block, the technique is widely used in modern electronic devices.

A charge pump is an important component in a PLL. The charge pump provides a high loop gain of the circuit, so that when the PLL is phase locked, the phase difference between the input and the output of the frequency divider is zero. It can reduce the variation of control signals in the voltage-controlled oscillator (VCO) and reduce output spurs (Spur). However, conventional charge pumps suffer from many limitations, as will be described below.

BRIEF SUMMARY OF THE INVENTION

In embodiments of the invention, a capacitor is introduced at the gate terminals of the switch transistor and the current source transistor to provide a feedback path that is opposite to an existing feedback path, such that the feedthrough is suppressed. Because of the reduced feedthrough effect, the decoupling capacitance at the gate terminal can be reduced, decreasing the die area of the charge pump. In some embodiments, the suppression of feedthrough can occur when the current source transistor is in the saturation region, resulting in a greater range of charge pump output voltage. In some embodiments, a mismatch between charge pump charging and discharging currents caused by feedthrough effects can be suppressed, and spurs in the PLL are reduced.

According to some embodiments of the present invention, a charge pump circuit includes a capacitor, a current source circuit coupled to the capacitor for providing a charging current and a discharging current to the capacitor. The current source circuit includes a switch transistor with a gate terminal for receiving a control signal, a current source transistor having a source terminal coupled to a drain of the switch transistor, and a feedthrough suppression capacitor coupled between a gate terminal of a gate terminal of the switch transistor and a gate terminal of the current source transistor. The feedthrough suppression capacitor is configured to lower a feedthrough effect.

In an embodiment of the above circuit, the current source circuit comprises a P-type current source circuit and an N-type current source circuit. In another embodiment, the P-type current source circuit comprises a P-type switch transistor coupled to a P-type current source transistor. In an embodiment, the N-type current source circuit comprises an N-type switch transistor coupled to an N-type current source transistor. In an embodiment, the feedthrough suppression capacitor has a preset capacitance, and if the capacitance of the capacitor is varied by 10% from the preset capacitance, the variation of the magnitude of the charging current and a discharging current is less than a first current threshold. In an embodiment, the switch transistor and the current source transistor comprise CMOS transistors.

According to some embodiments of the present invention, a charge pump circuit includes a capacitor and a current source circuit coupled to the capacitor for providing a charging current and a discharging current to the capacitor. The current source circuit includes a switch transistor with a gate terminal for receiving a control signal, a current source transistor having a source terminal coupled to a drain of the switch transistor, and a coupling element coupled between a gate terminal of the switch transistor and a gate terminal of the current source transistor. In an embodiment, the switch transistor and the current source transistor are MOS (Metal-Oxide-Semiconductor) transistors. In an embodiment, the current source circuit is configured such that, if a high signal is applied to an input of the switch transistor, it lowers the drain voltage of the switch transistor and lowers the gate voltage of the current source transistor, and the coupling element between the gate terminal of the switch transistor and the gate terminal of the current source transistor lowers the gate voltage of the current source transistor. In an embodiment, the current source circuit comprises a P-type current source circuit and an N-type current source circuit. In an embodiment, the P-type current source circuit comprises a P-type switch transistor coupled to a P-type current source transistor. In an embodiment, the N-type current source circuit comprises an N-type switch transistor coupled to an N-type current source transistor. In an embodiment, the coupling element comprises a capacitor.

According to some embodiments of the present invention, a phase locked loop (PLL) circuit includes a phase detector, a charge pump circuit coupled to the phase detector, a low-pass filter coupled to the charge pump circuit, a voltage-controlled oscillator (VCO) coupled to the low-pass filter, and a frequency divider coupled between the VCO and the phase detector. The charge pump circuit includes a capacitor and a current source circuit coupled to the capacitor for providing a charging current and a discharging current to the capacitor. The current source circuit includes a switch transistor with a gate terminal for receiving a control signal, a current source transistor having a source terminal coupled to a drain of the switch transistor, and a feedthrough suppression capacitor coupled between a gate terminal of the switch transistor and a gate terminal of the current source transistor. The coupling element is configured to lower a feedthrough effect.

In an embodiment of the above PLL circuit, the current source circuit comprises a P-type current source circuit and an N-type current source circuit. In an embodiment, the P-type current source circuit comprises a P-type switch transistor coupled to a P-type current source transistor. In an embodiment, the N-type current source circuit comprises an N-type switch transistor coupled to an N-type current source transistor.

The following description, together with the accompanying drawings, will provide further understanding of the nature and advantages of the claimed invention.

DETAILED DESCRIPTION OF THE INVENTION

Various embodiments of the present invention are described below. It should be noted that, when appropriate, the exemplary embodiments and features can be combined with each other.

A charge pump is an important component in a PLL (Phase-Locked Loop, abbreviated to PLL). The charge pump provides a high loop gain of the circuit, so that, when the PLL is phase locked, the phase difference between the input and the output of the frequency divider is zero. It can reduce the variation of control signals in the voltage-controlled oscillator (VCO) and reduce output spurs (Spur).

Figure 1:
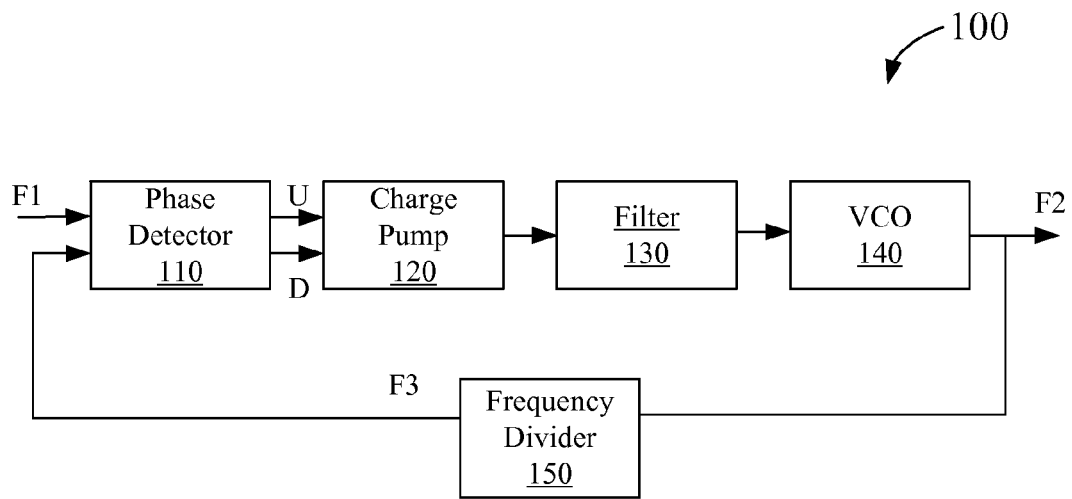
FIG. 1 is a simplified block diagram of a phase locked loop (PLL) according to an embodiment of the present invention.

FIG. 1 is a simplified block diagram of a phase locked loop (PLL) according to an embodiment of the present invention. As shown in FIG. 1, phase locked loop 100 includes a phase detector 110, a charge pump circuit 120, a low-pass filter (LPF) 130, a voltage-controlled oscillator (VCO) 140, and a frequency divider 150.

The output of charge pump circuit 120 is connected to low-pass filter 130, which may include a resistor and a capacitor. Charge pump circuit 120 discharges the capacitor when charge pump circuit 120 receives the signal D, and charges the capacitor when charge pump circuit 120 receives the signal U. A pulse output from the charge pump circuit is converted into a DC analog signal by the low-pass filter 1.

Phase detector 110 then compares the phases of two input signals, first signal F1 which is a reference signal and a second signal which is a feedback signal from frequency divider 150. In some embodiments, when the phase of an output from the frequency divider lags the phase of the reference clock, phase detector 110 outputs a pulse U for increasing the frequency, and when the phase of an output from the frequency divider leads the phase of the reference clock, phase detector 110 outputs a pulse D for decreasing the frequency. The output of charge pump circuit 120 is connected to low-pass filter 130, which may include a resistor and a capacitor. Charge pump circuit 120 discharges the capacitor when charge pump circuit 120 receives the signal D, and charges the capacitor when charge pump circuit 120 receives the signal U. Low-pass filter 130 provides a DC analog signal. VCO 140 receives the analog signal output and outputs a constant-frequency signal F2. Frequency divider 150 can include a counter and divides an output from the VCO 140 by K, an arbitrary natural number, and provide the divided output F3 to the phase detector 110.

In PLL 100, phase detector 110, charge pump circuit 120, low-pass filter (LPF) 130, voltage-controlled oscillator (VCO) 140, and frequency divider 150 form one loop to control the phases, i.e., frequencies of two input signals to the phase detector to be equal to each other. The frequency of an output from the VCO 140 is K times the input frequency. By arbitrarily setting the value K, a frequency which is an arbitrary natural multiple of the input frequency can be obtained.

In PLL, output spurs are due to limitations in the charge pump, which result in a mismatch of the timing and magnitude in the charge pump charging and discharging currents and lead to periodic fluctuations in the control voltage in the VCO. Thus, qualities of the output signal are adversely affected.

Clock feedthrough (Feedthrough) is due to the presence of gate-source and gate-drain overlap capacitance in the charge pump current source switch, so that, when a switching signal is applied to the gate, it will affect the control voltage or the output current. This effect causes mismatch of the charge pump charging and discharging of current, resulting in increased output spurs. Due to the presence of overlap capacitance, it is difficult to eliminate the feedthrough effect, and it has become a difficult issue in charge pump design.

Figure 2:
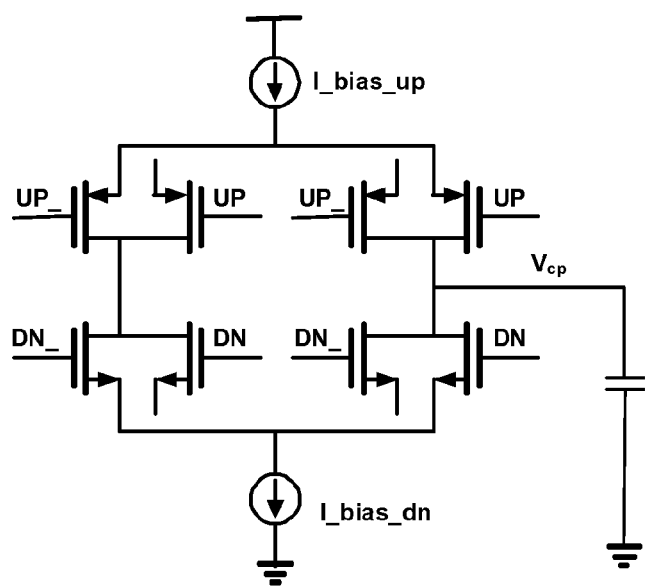
FIG. 2 is a schematic diagram illustrating a conventional charge pump circuit.

FIG. 2 is a schematic diagram illustrating a conventional charge pump circuit. In one method for suppressing feedthrough, a dummy transistor is selected to be a transistor that is identical to the switch transistor. As shown in FIG. 2, the clock signals at the gate terminals of the switch transistor and dummy transistor are opposite in phase. The design is intended to have the feedthrough effect of the switch transistor and the dummy transistor cancel each other, thereby reducing the effects of feedthrough. However, to offset the effects of feedthrough, switch and dummy transistors must have the same overlap capacitance, which requires that the switch operates in the saturated region. Further, since the switch control is at the drain terminal, the charge pump output range is greatly reduced, resulting in the VCO gain increase and noise performance deterioration.

In another charge pump design, the switch is disposed on the source side of the current source transistor so that its gate terminal is further away from the output, to reduce direct feedthrough of the clock on the output terminal. When the clock signal is applied to the gate terminal, the voltage at the source terminal of the current source drops rapidly. Through the gate-source overlap capacitance, the voltage at the gate terminal drops, and the output current is reduced. If the gate terminal decoupling capacitor is small, the gate terminal voltage fluctuations are large and can cause the output current fluctuations; if the gate terminal decoupling capacitor is large, the gate terminal voltage fluctuation is small, and the time it takes to return to normal bias is prolonged, causing the output current to deviate from the ideal value for a longer period of time. If the decoupling capacitor is particularly large, the voltage fluctuation of the gate terminal can be negligible. However, this would greatly increases the area of the charge pump. Therefore, regardless the size of gate terminal decoupling capacitor, mismatch of charging and discharging current of the charge pump is likely to occur, causing spurs.

Therefore, there is a need for improved designs of charge pumps with source controlled switches. In some embodiments of the invention, a capacitor is introduced at the gate terminals of the switch transistor and the current source transistor to provide a feedback path that is opposite to an existing feedback path, such that the feedthrough is suppressed. Because of the reduced feedthrough effect, the decoupling capacitance at the gate terminal can be reduced, decreasing the die area of the charge pump. In some embodiments, the suppression of feedthrough can occur when the current source transistor is in the saturation region, resulting in greater range of charge pump output voltage. In some embodiments, mismatch between charge pump charging and discharging currents caused by feedthrough effects can be suppressed, and spurs in the PLL are reduced.

Figure 3:
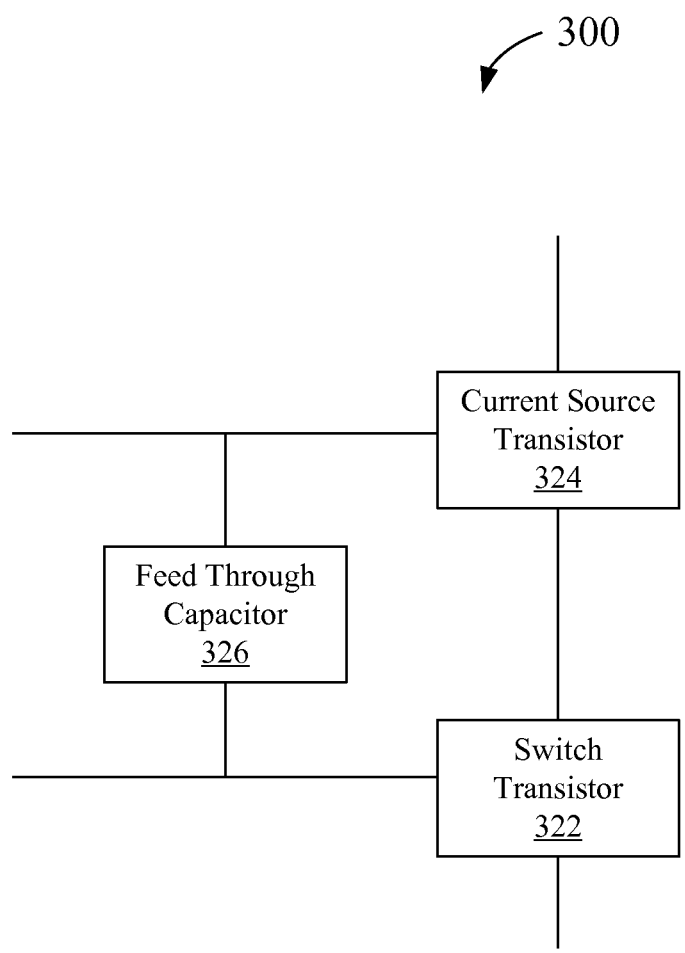
FIG. 3 is a simplified block diagram illustrating a charge pump circuit according to an embodiment of the present invention.

FIG. 3 is a simplified block diagram illustrating a charge pump circuit according to an embodiment of the present invention. As shown in FIG. 3, the output stage of a charge pump circuit includes current source circuit 300 that includes a switch transistor 322, a current source transistor 324, and a capacitor 326. The gate terminal of switch transistor 322 is configured to be the on/off control terminal of current source circuit 300. The source terminal of current source transistor 324 is coupled to the drain terminal of switch transistor 322, and the drain terminal of current source transistor 324 is configured to be the output terminal of charge pump 300. Capacitor 326 is coupled between the gate terminal of switch transistor 322 and the gate terminal of current source transistor 324. Other components in charge pump 30, which could be coupled to the above-mentioned blocks or between the blocks, are omitted in FIG. 3.

As shown in FIG. 3, capacitor 326 is coupled between the gate terminal of switch transistor 322 and the gate terminal of current source transistor 324 to suppress feedthrough effects. This design can also increase the charge pump output voltage range, and inhibit the effect of feedthrough on the mismatch of charge pump charge and discharge currents and improve the performance of the PLL. In some embodiments, current source circuit 300 in charge pump 30 can include a P-type current source and an N-type current source. The P-type current source and the N-type current source can each have, respectively, a feedthrough suppression capacitor.

In some embodiments, the impedance of feedthrough suppression capacitance 326 has a preset value. For example, when the preset value is varied up or down by 10%, the range of variation of the output current is smaller than or equal to a first current threshold, for example, not exceeding 2%. Thus, better suppression of feedthrough effect can be achieved.

In some embodiments, switch transistor 322 and current source transistor 324, and their associated dummy transistors may be formed of NMOS transistors. In other embodiments, switch transistor 322 and current source transistor 324, and their associated dummy transistors may be formed of PMOS transistors. In some embodiments, the charge pump can have two current source circuits formed with CMOS transistors. In this case, a first current source circuit can be implemented in NMOS transistors, in which switch transistor 322 and current source transistor 324, and their associated dummy transistors may be formed of NMOS transistors. A second current source circuit can be implemented in PMOS transistors, in which switch transistor 322 and current source transistor 324, and their associated dummy transistors may be formed of PMOS transistors.

The operation of the feedthrough capacitor is described using NMOS transistors as an example, with reference to the block diagram in FIG. 3. If a first high pulse signal is applied at the gate of switch transistor 322, then the drain of switch transistor 322 becomes low. As a result, the gate of current source transistor 324 is pulled low to form a first low pulse signal. Because of capacitor 326, the first high pulse signal causes a second high pulse signal at the gate of transistor 324, which counters the second low pulse signal at the gate of transistor 324, and suppresses the feedthrough effect. Similarly, if a low signal is applied at the gate of switch transistor 322, the gate of current source transistor 324 is pushed high. However, capacitor 326 will attempt to pull down the gate of current source transistor 324, again suppressing the feedthrough effect.

Figure 4:
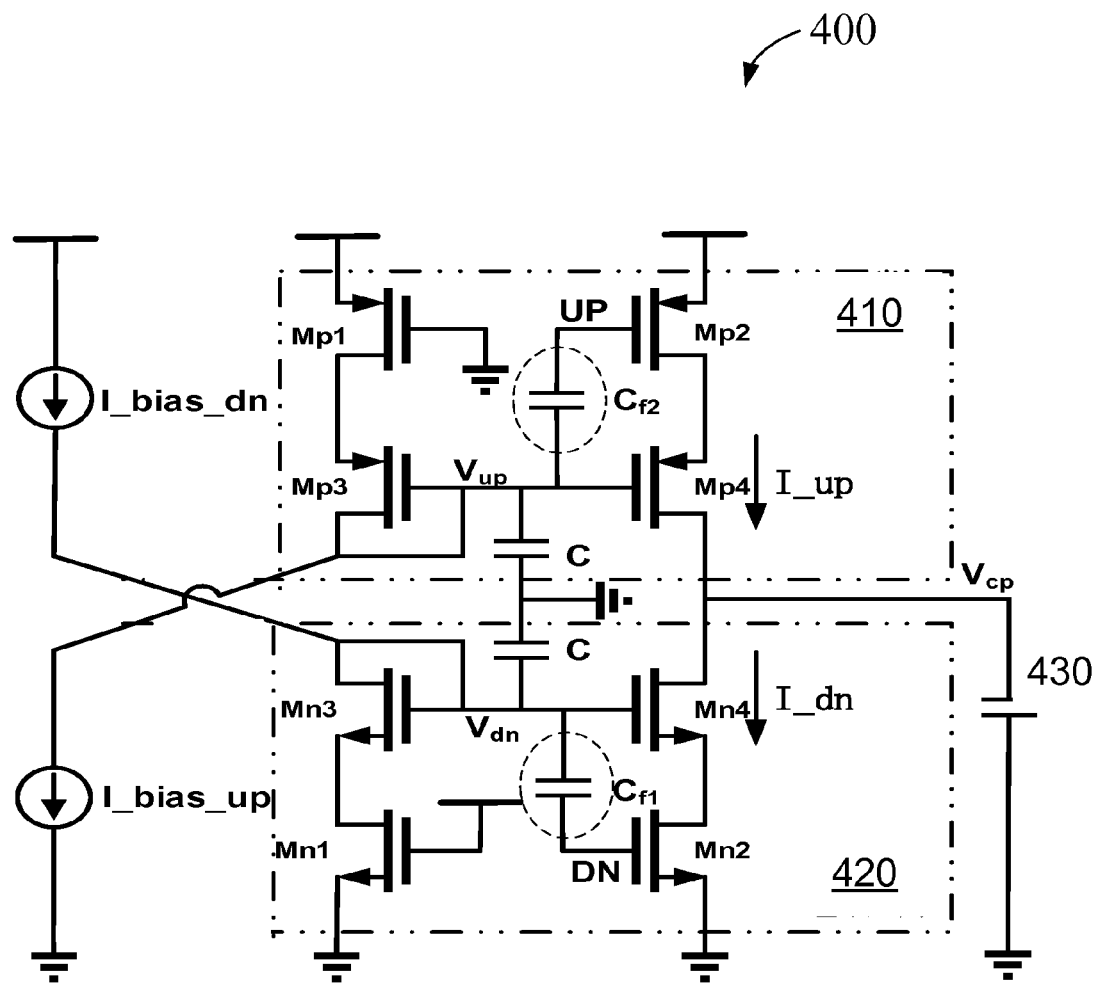
FIG. 4 is a schematic circuit diagram illustrating a charge pump circuit according to an embodiment of the present invention.

FIG. 4 is a schematic circuit diagram illustrating a charge pump circuit according to an embodiment of the present invention. As shown in FIG. 4, charge pump circuit 400 includes a P-type current source circuit 410 and an N-type current source circuit 420 that combine to provide charging and discharging of output capacitor 430. The voltage at output capacitor is marked as an output voltage Vcp.

P-type current source circuit 410 includes a P-type current source transistor Mp4 and a P-type switch transistor Mp2 connected in series to provide a charging current I_up. A feedthrough suppression capacitor Cf2 is coupled between the gate terminals of Mp4 and Mp2. In addition, a P-type transistor Mp3 forms a current mirror with Mp4, and a P-type transistor Mp1 is connected in series with Mp3. P-type current source circuit 610 also is coupled to a current sink I_bias_up.

N-type current source circuit 420 includes an N-type current source transistor Mn4 and an N-type switch transistor Mn2 connected in series to provide a discharging current I_dn. A feedthrough suppression capacitor Cf1 is coupled between the gate terminals of Mn4 and Mn2. In addition, an N-type transistor Mn3 forms a current mirror with Mn4, and an N-type transistor Mn1 is connected in series with Mn3. N-type current source circuit 620 also is coupled to a current source I_bias_dn.

As described above, the feedthrough suppression capacitors, Cf1 and Cf2, are coupled between the gate terminal of the switch transistor and the gate terminal of the current source transistor to provide positive feedback. This negative feedback works in an opposite direction to the negative feedback between the gate terminal of the switch transistor and the gate terminal of the current source transistor. As a result, the feedthrough effect can be reduced.

Figure 5:
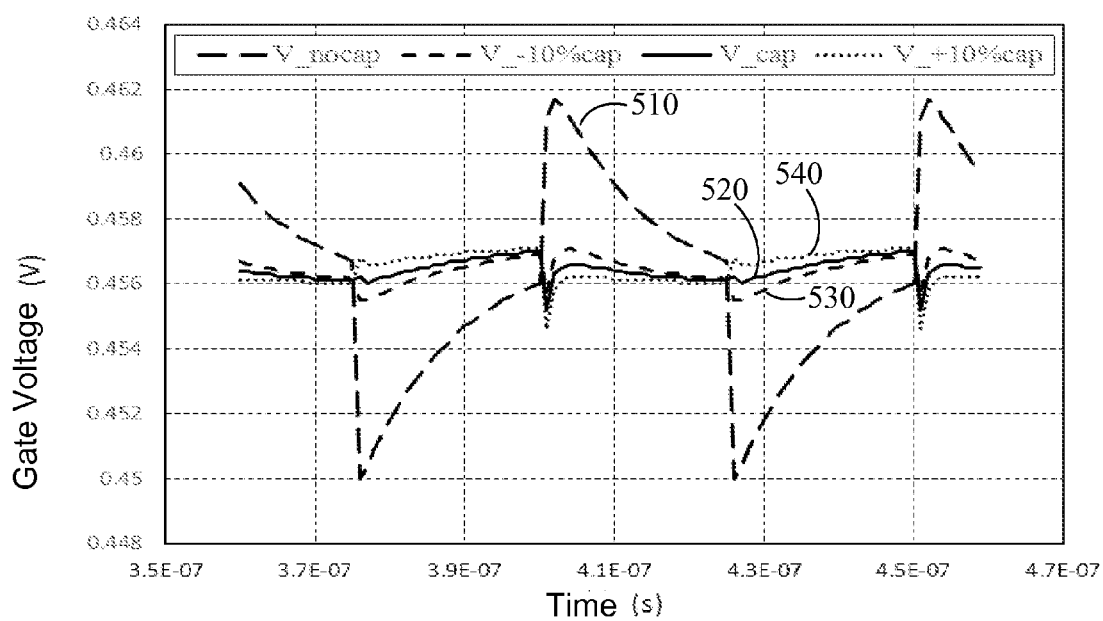
FIG. 5 is a waveform diagram illustrating the waveform of the gate voltage of an output stage current source transistor in a charge pump circuit according to an embodiment of the present invention.

FIG. 5 is a waveform diagram illustrating the waveform the gate voltage of an output stage current source transistor in a charge pump circuit according to an embodiment of the present invention. In this example, the duty cycle of a square wave switching signal is 50%, and the gate voltage of an output stage current source transistor in a charge pump circuit is plotted with respect to time under four different conditions. In FIG. 5, curve 510 (V_nocap) shows the variation of the gate voltage with time for a charge pump without a feedback capacitor, i.e., when the feedback capacitance is 0. Curve 520 (V_cap) shows the variation of the gate voltage with time for a charge pump with a feedback capacitor having an optimal capacitance. It can be seen that the variation of the gate voltage of the current source transistor is reduced from about 12 mV to about 2.5 mV when the feedback capacitor is included. For example, the variation is reduced from 0.45-0.46 V (0.01 V) to 0.455-0.457 V (0.002 V). The effect of the capacitance of the feedback capacitance is shown by curves 530 and 540. Curve 530 (V_−10% cap) shows the variation of the gate voltage for a charge pump with a feedback capacitor having a capacitance that is 90% of the optimal capacitance. Curve 540 (V_+10% cap) shows the variation of the gate voltage for a charge pump with a feedback capacitor having a capacitance that is 110% of the optimal capacitance. It can be seen in FIG. 6 that, when the switch is closed, the current is substantially at 9.8E-05 amperes with the feedback capacitor. On the other hand, without the capacitor, the current can be seen to rise from 9.0E-05 amperes to 9.8E-05 amperes.

Figure 6:
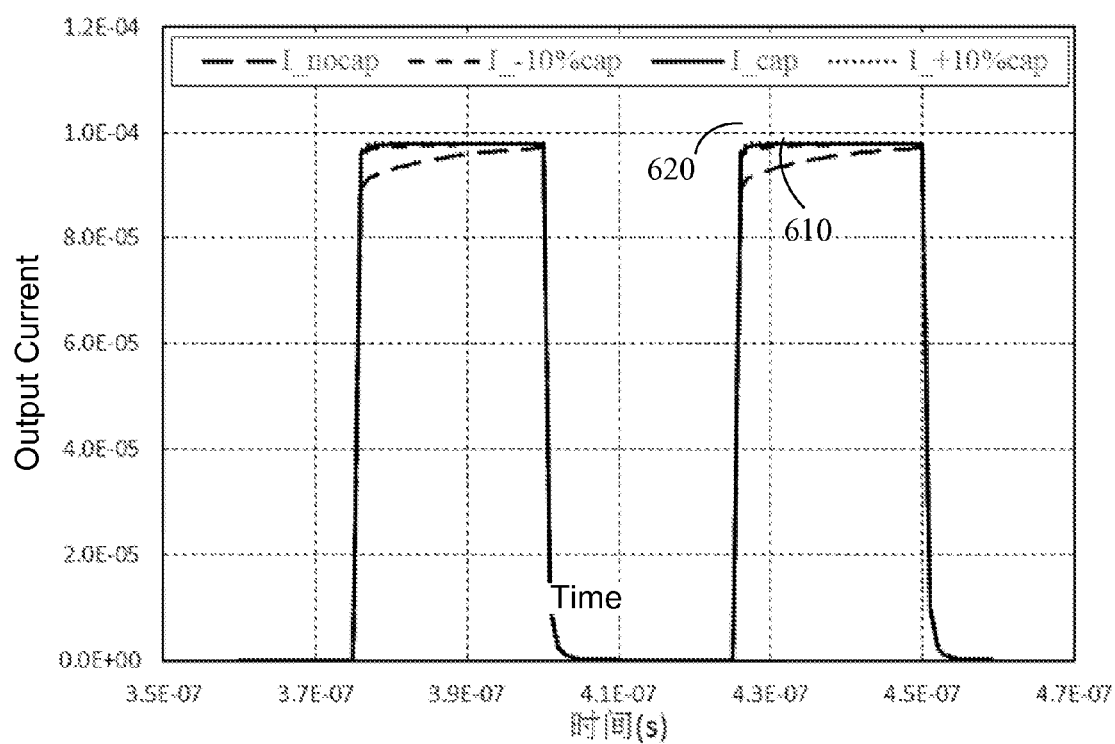
FIG. 6 is a waveform diagram illustrating the waveform of output current in an output stage in a charge pump circuit according to an embodiment of the present invention.

FIG. 6 is a waveform diagram illustrating the waveform of output current in an output stage in a charge pump circuit according to an embodiment of the present invention. In this example, the duty cycle of a square wave switching signal is 50%, and output current of an output stage current source transistor in a charge pump circuit is plotted with respect to time under four different conditions. In FIG. 6, curve 610 (I_nocap) shows the variation of output current with time for a charge pump without a feedback capacitor, i.e., when the feedback capacitance is 0. Curve 620 (I_cap) shows the variation of the output current with time for a charge pump with a feedback capacitor having an optimal capacitance. It can be seen that, when the feedback capacitor is included, the output current reaches the target value faster than the case without the feedback capacitor. The effect of the capacitance of the feedback capacitance is also shown in FIG. 6. The curve marked with I_−10% cap in the caption shows the variation of the output current for a charge pump with a feedback capacitor having a capacitance that is 90% of the optimal capacitance. The curve marked with I_+10% cap in the caption shows the variation of the output current for a charge pump with a feedback capacitor having a capacitance that is 110% of the optimal capacitance. In a phase locked loop, the switching signal is a narrow pulse; so, without the feedback capacitance, the output current may not reach the target value. This can result in a mismatch in dynamic current in the charge pump, causing increase in output spurs in the PLL and deterioration of the overall performance.

Figure 7:
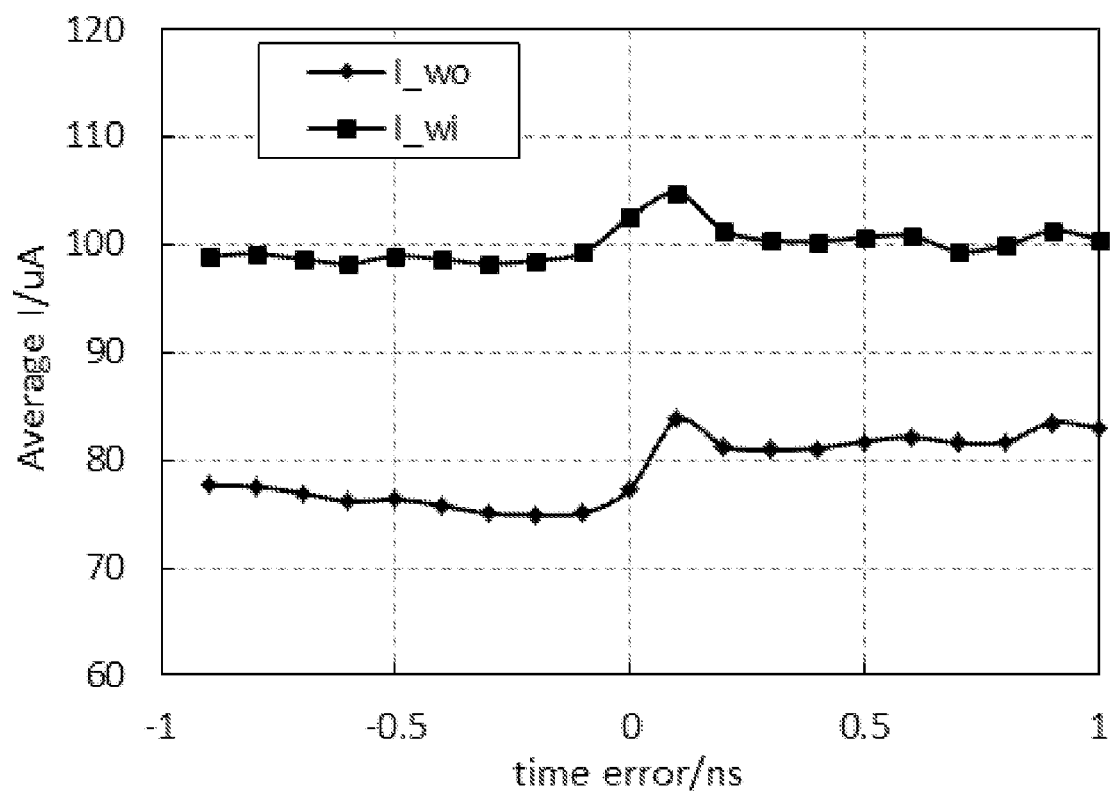
FIG. 7 is a waveform diagram illustrating the effective current versus the switch on time.

FIG. 7 is a waveform diagram illustrating the effective current versus the switch on time. As described above, FIGS. 5-6 show the transient voltage and current under the switch signal with the duty cycle of 50%. However, when the phase lock loop works, the switch on time is a very small period and may be less than 1 ns. So a simulation with a very short switch on time is carried out and the effective current versus the switch on time is shown in FIG. 7. The switch on time means the time error of inputs of the phase frequency detector. The positive time error means N current source is switched on and the negative time error means P current source is switched on. So the different value between positive and negative times error means the current mismatch of charge pump. In FIG. 7, I_wo and I_wi illustrate effective currents before and after the addition of $C_f$. According to the simulation results, it can be seen that the new feed through capacitor $C_f$ increases the effective current from ~80 μA to ~100 μA (the target value). So the feed through capacitor $C_f$ helps to increase the switch on speed significantly. Further, I_wi is more constant than I_wo, so the current matching is improved substantially.

Charge pump circuits according to embodiments of the present invention can also provide the benefit of reducing circuit area. This benefit is described below using the charge pump of FIG. 4 as an example. Before transistor DN switches to high, the source voltage of Mn4 is about $V_{dn}-V_{th}$ which will go to near zero after Mn2 is switched on. So the change of source voltage is about $V_{dn}-V_{th}$. Because of the gate-source capacitance Cgs of Mn4, the voltage change of $V_{dn}$ can be given in the following equation:

$$\Delta V_{dn} = -\frac{C_{gs}}{C+C_{gs}}(V_{dn}-V_{th})$$

As an example, if the overdrive voltage is 100 mV and the target $\Delta V_{dn} < 2$ mV, so the decoupling capacitance $C \approx 50\ C_{gs}$. If Cgs=300 fF, the required capacitance C=15 pF, which occupies a large area. After introduction of $C_f$, the above equation will introduce a new term:

$$\Delta V_{dn} = \frac{C_f}{C+C_f}VDD - \frac{C_{gs}}{C+C_{gs}}(V_{dn}-V_{th})$$

Under the power supply of 1V, Cgs=300 fF and C=1pF, a feedthough cap $C_f$ of 23 fF can suppress the variation of Vdn to less than 2 mV. From above analysis, the decoupling capacitor is reduced from 15 pF to 1 pF at the expense of a new capacitor of 23 fF, so the circuit cost is reduced significantly.

Thus, in embodiments of the invention, a capacitor is introduced at the gate terminals of the switch transistor and the current source transistor to provide a feedback path that is opposite to an existing feedback path, such that the feedthrough is suppressed. Because of the reduced feedthrough effect, the decoupling capacitance at the gate terminal can be reduced, decreasing the die area of the charge pump. In some embodiments, the suppression of feedthrough can occur when the current source transistor is in the saturation region, resulting in greater range of charge pump output voltage. In some embodiments, mismatch between charge pump charging and discharging currents caused by feedthrough effects can be suppressed, and spurs in the PLL are reduced.

Those skilled in the art should understand that the above-described modules or steps of the embodiments may be designed using simulation in a general purpose computing device. The circuit components can be made into respective integrated circuit modules, or in a plurality of modules made into a single integrated circuit.

Although certain embodiments of the present invention are described in detail, those skilled in the art will appreciate that the above examples are for illustration only and not to limit the scope of the invention. Thus, those skilled in the art would appreciate that, aside from embodiments of the present disclosure, various modifications and changes can be made without departing from the spirit and scope of the present disclosure.

What is claimed is:
1. A charge pump circuit, comprising:
   a capacitor;

a current source circuit coupled to the capacitor for providing a charging current and a discharging current to the capacitor;

wherein the current source circuit includes:
a switch transistor, with a gate terminal for receiving a control signal;
a current source transistor, having a source terminal coupled to a drain of the switch transistor; and
a feedthrough suppression capacitor, coupled between a gate terminal of a gate terminal of the switch transistor and a gate terminal of the current source transistor, the feedthrough suppression capacitor configured to lower a feedthrough effect.

2. The charge pump circuit of claim 1, wherein the current source circuit comprises a P-type current source circuit and an N-type current source circuit.

3. The charge pump circuit of claim 2, wherein the P-type current source circuit comprises a P-type switch transistor coupled to a P-type current source transistor.

4. The charge pump circuit of claim 2, wherein the N-type current source circuit comprises an N-type switch transistor coupled to an N-type current source transistor.

5. The charge pump circuit of claim 1, wherein the feedthrough suppression capacitor has a preset capacitance, wherein if the capacitance of the capacitor is varied by 10% from the preset capacitance, the variation of the magnitude of the charging current and a discharging current is be less than a first current threshold.

6. The charge pump circuit of claim 1, wherein the switch transistor and the current source transistor comprise CMOS transistors.

7. A charge pump circuit, comprising:
a capacitor;
a current source circuit coupled to the capacitor for providing a charging current and a discharging current to the capacitor;

wherein the current source circuit includes:
a switch transistor, with a gate terminal for receiving a control signal;
a current source transistor, having a source terminal coupled to a drain of the switch transistor; and
a coupling element, coupled between a gate terminal of the switch transistor and a gate terminal of the current source transistor, the coupling element configured to lower a feedthrough effect.

8. The charge pump circuit of claim 7, wherein the switch transistor and the current source transistor are MOS (Metal-Oxide-Semiconductor) transistors.

9. The charge pump circuit of claim 7, wherein the current source circuit is configured such that:

if a high signal is applied to an input of the switch transistor, it lowers the drain voltage of the switch transistor and lowers the gate voltage of the current source transistor; and
the coupling element between the gate terminal of the switch transistor and the gate terminal of the current source transistor lowers the gate voltage of the current source transistor.

10. The charge pump circuit of claim 7, wherein the current source circuit comprises a P-type current source circuit and an N-type current source circuit.

11. The charge pump circuit of claim 10, wherein the P-type current source circuit comprises a P-type switch transistor coupled to a P-type current source transistor.

12. The charge pump circuit of claim 10, wherein the N-type current source circuit comprises an N-type switch transistor coupled to an N-type current source transistor.

13. The charge pump circuit of claim 7, wherein the coupling element comprises a capacitor.

14. A phase locked loop (PLL) circuit, comprising:
a phase detector;
a charge pump circuit coupled to the phase detector;
a low-pass filter coupled to the charge pump circuit;
a voltage-controlled oscillator (VCO) coupled to the low-pass filter; and
a frequency divider coupled between the VCO and the phase detector;

wherein the charge pump circuit includes a capacitor and a current source circuit coupled to the capacitor for providing a charging current and a discharging current to the capacitor;

wherein the current source circuit includes:
a switch transistor, with a gate terminal for receiving a control signal;
a current source transistor, having a source terminal coupled to a drain of the switch transistor; and
a feedthrough suppression capacitor, coupled between a gate terminal of a gate terminal of the switch transistor and a gate terminal of the current source transistor.

15. The PLL circuit of claim 14, wherein the current source circuit comprises a P-type current source circuit and an N-type current source circuit.

16. The PLL circuit of claim 14, wherein the P-type current source circuit comprises a P-type switch transistor coupled to a P-type current source transistor.

17. The PLL circuit of claim 14, wherein the N-type current source circuit comprises an N-type switch transistor coupled to an N-type current source transistor.

* * * * *